US009490264B2

(12) United States Patent
Mazure et al.

(10) Patent No.: US 9,490,264 B2
(45) Date of Patent: Nov. 8, 2016

(54) DEVICE HAVING A CONTACT BETWEEN SEMICONDUCTOR REGIONS THROUGH A BURIED INSULATING LAYER, AND PROCESS FOR FABRICATING SAID DEVICE

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 464 days.

(21) Appl. No.: 12/984,466

(22) Filed: Jan. 4, 2011

(65) Prior Publication Data

US 2011/0169090 A1    Jul. 14, 2011

(30) Foreign Application Priority Data

Jan. 14, 2010  (FR) ..................................... 10 50244

(51) Int. Cl.
| H01L 21/331 | (2006.01) |
| H01L 21/8222 | (2006.01) |
| H01L 27/12 | (2006.01) |
| H01L 21/74 | (2006.01) |
| H01L 21/84 | (2006.01) |
| H01L 27/108 | (2006.01) |
| H01L 29/732 | (2006.01) |
| H01L 29/78 | (2006.01) |
| H01L 29/786 | (2006.01) |

(52) U.S. Cl.
CPC ......... *H01L 27/1203* (2013.01); *H01L 21/743* (2013.01); *H01L 21/84* (2013.01); *H01L 27/10802* (2013.01); *H01L 29/732* (2013.01); *H01L 27/10873* (2013.01); *H01L 29/7841* (2013.01); *H01L 29/78639* (2013.01)

(58) Field of Classification Search
CPC .. H01L 27/1203; H01L 21/84; H01L 21/743
USPC ................... 257/127, 170, E29.012; 438/311
See application file for complete search history.

(56) References Cited

U.S. PATENT DOCUMENTS

| 4,169,233 A | 9/1979 | Haraszti ........................ 307/355 |
| 5,028,810 A | 7/1991 | Castro et al. ................. 307/201 |
| 5,306,530 A | 4/1994 | Strongin et al. ............... 427/533 |
| 5,325,054 A | 6/1994 | Houston ........................ 324/158 |
| 5,455,791 A | 10/1995 | Zaleski et al. ............ 365/185.26 |
| 5,557,231 A | 9/1996 | Yamaguchi et al. .......... 327/534 |

(Continued)

FOREIGN PATENT DOCUMENTS

| EP | 0 475 280 A1 | 3/1992 |
| EP | 1 081 748 A2 | 3/2001 |

(Continued)

OTHER PUBLICATIONS

English Translation for JP 04-280469.*

(Continued)

*Primary Examiner* — David Chen
(74) *Attorney, Agent, or Firm* — Jeffrey T. Holman

(57) ABSTRACT

The invention relates to a semiconductor device produced on a semiconductor-on-insulator substrate that includes a thin layer of semiconductor material separated from a base substrate by a buried insulating layer, the device including a first conducting region in the thin layer, a second conducting region in the base substrate and a contact connecting the first region to the second region through the insulating layer. The invention also relates to a process for fabricating such semiconductor devices.

14 Claims, 6 Drawing Sheets

(56) References Cited

U.S. PATENT DOCUMENTS

| | | | |
|---|---|---|---|
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,869,872 A | 2/1999 | Asai et al. | 257/360 |
| 5,889,293 A * | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,258,650 B1 * | 7/2001 | Sunouchi | 438/238 |
| 6,300,218 B1 | 10/2001 | Cohen et al. | 438/423 |
| 6,352,882 B1 * | 3/2002 | Assaderaghi et al. | 438/155 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,790,713 B1 * | 9/2004 | Horch | 438/135 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 2001/0038299 A1 | 11/2001 | Afghahi et al. | 326/86 |
| 2001/0047506 A1 | 11/2001 | Houston | 716/4 |
| 2002/0036321 A1 * | 3/2002 | Nii | 257/347 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0002185 A1 * | 1/2004 | Takahashi | 438/224 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 095 407 A1 | 5/2001 |
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04-225276 | 8/1992 |
| JP | 04-280469 | 10/1992 |
| JP | 04345064 A | 12/1992 |
| JP | 08255846 | 10/1996 |
| JP | 09-232537 | 9/1997 |
| JP | 09232446 | 9/1997 |
| JP | 10125064 A | 5/1998 |
| JP | 2000196089 A | 7/2000 |
| JP | 2004303499 | 10/2004 |
| KR | 2001-0011793 A | 2/2001 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,553, filed Jun. 3, 2010.
U.S. Appl. No. 12/793,515, filed Jun. 3, 2010.
U.S. Appl. No. 12/789,100, filed May 27, 2010.
U.S. Appl. No. 12/961,293, filed Dec. 6, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al., "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.

(56) References Cited

OTHER PUBLICATIONS

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al."An Innovative sub-32nm SRAM Voltage Sense Amplifier in Double-Gate CMOS Insensitive to Process Variations and Transistor Mismatch" The 15th IEEE International Conference on Electronics, Circuits and Systems, pp. 554-557, (ICECS 2008).

P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, (2007).

K. Roy, et al. "Double-Gate SOI Devices for Low-Power and High-Performance Applications," IEEE Computer Society, The British Library, IEEE Xplore, 8 pages, (2006).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Black-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

European Search Report Application No. EP 10 29 0217 dated Sep. 15, 2010.

U.S. Appl. No. 12/886,421, filed Sep. 20, 2010.

U.S. Appl. No. 12/942,754, filed Nov. 9, 2010.

European Search Report Application No. EP 10290181.6 dated Jan. 14, 2011.

U.S. Appl. No. 13/007,483, filed Jan. 14, 2011.

U.S. Appl. No. 13/013,580, filed Jan. 25, 2011.

U.S. Appl. No. 12/880,806, filed Sep. 13, 2010.

U.S. Appl. No. 12/898,230, filed Oct. 5, 2010.

U.S. Appl. No. 12/946,135, filed Nov. 15, 2010.

U.S. Appl. No. 12/974,916, filed Dec. 21, 2010.

U.S. Appl. No. 12/974,822, filed Dec. 21, 2010.

U.S. Appl. No. 13/039,167, filed Mar. 2, 2011.

European Search Report Application No. EP 09290838.3 dated Feb. 16, 2010.

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying" the SOI Floating Body Effect, SOI Industry Consortium, pp. 2-7 (2009).

\* cited by examiner

DEVICE HAVING A CONTACT BETWEEN SEMICONDUCTOR REGIONS THROUGH A BURIED INSULATING LAYER, AND PROCESS FOR FABRICATING SAID DEVICE

FIELD OF THE INVENTION

The field of the invention is that of semiconductor devices produced on a semiconductor-on-insulator (SeOI) substrate.

BACKGROUND OF THE INVENTION

Such an SeOI substrate comprises a thin layer of semiconductor material separated from a base substrate by means of a buried insulating layer.

A semiconductor device produced on such a substrate generally has a conducting region produced in the thin layer above the insulating layer, for example a drain region or a source region of an FET transistor, or else an emitter region of a bipolar transistor associated with an FET transistor in order to inject charge into the channel of the FET transistor.

A semiconductor device on an SeOI substrate may also include a conducting region produced in the base substrate beneath the insulating layer, for example a buried back control gate region facing the channel of an FET transistor.

Connections have to be made in order to supply these various types of conducting region. In general, these connections are produced on the front face side of the semiconductor substrate. Thus, there would typically be, for an FET transistor, a word line WL, a bit line BL and a source line SL which are connected to the front control gate region, the drain region and the source region respectively by means of metal connections produced on the front face side.

In general it is desirable to limit the number of metal connections so as to simplify the fabrication of the semiconductor device, especially as regards the lithography operations.

Moreover, it is in general desirable to limit the footprint of the semiconductor device (i.e. the area occupied by the latter). Now, making a connection via the front face inevitably increases the footprint.

Even more generally, it is desirable to simplify as far as possible the production of these connections.

The present invention now satisfies these requirements, by providing a semiconductor device and a process of producing the same.

SUMMARY OF THE INVENTION

In one aspect, the invention relates to a semiconductor device provided on a SeOI substrate, wherein the substrate comprises a thin layer of semiconductor material separated from a base substrate by a buried insulating layer, and the device comprises a first conducting region in the thin layer, a second conducting region in the base substrate, and a contact connecting the first region to the second region through the insulating layer.

The invention also relates to a process for fabricating the semiconductor device on a SeOI substrate, wherein the substrate comprises a thin layer of semiconductor material separated from a base substrate by a buried insulating layer, and the device comprises a first conducting region in the thin layer, a second conducting region in the base substrate. The process comprises providing a contact connecting the first region to the second region through the insulating layer.

BRIEF DESCRIPTION OF THE DRAWINGS

The features and advantages of the present invention will become more clearly apparent on reading the following detailed description of preferred embodiments thereof, given by way of a non-limiting example and with reference to the appended drawings in which.

DETAILED DESCRIPTION OF THE INVENTION

Figure 1:
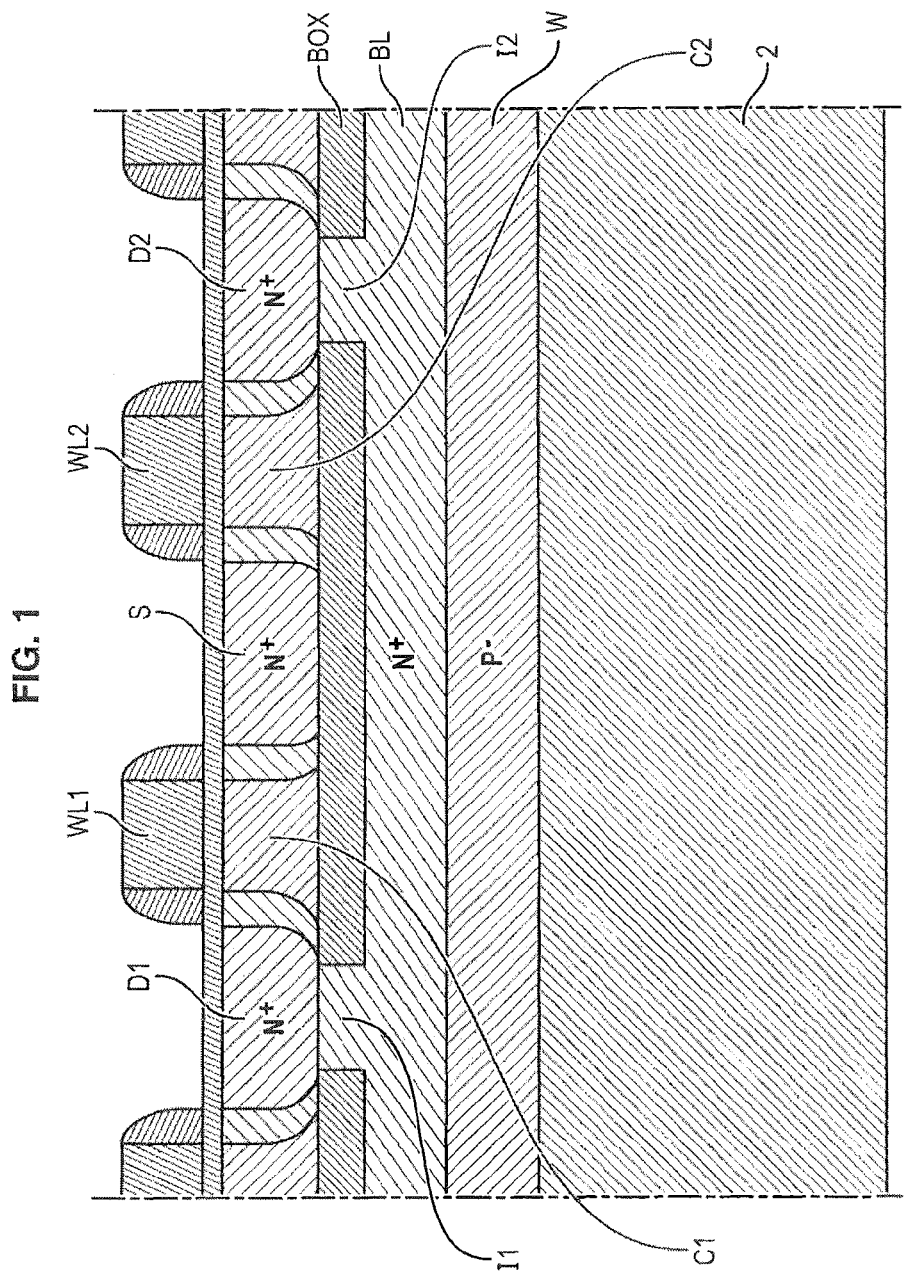
FIG. 1 shows one possible embodiment of a buried bit line beneath the insulating layer and connected to a drain region of an FET transistor by means of a contact through the insulating layer.

As noted, the semiconductor device is produced on a SeOI substrate comprising a thin layer of semiconductor material separated from a base substrate by means of a buried insulating layer, with the device comprising a first conducting region in the thin layer and a second conducting region in the base substrate and a contact connecting the first region to the second region through the insulating layer.

Certain preferred, but non-limiting, features of this device are the following:

the first region, the second region and the contact have a conductivity of the same type;

the first region is a drain region of a transistor and the second region belongs to a buried bit line;

the first region is a source region of a transistor and the second region belongs to a buried source line;

the first region constitutes the emitter of a bipolar transistor and the second region belongs to a buried injection line;

the second region is a back control gate region of a transistor and the first region belongs to a back control gate drive line;

the contact is formed from a metallic interconnect material; and the first region and the second region have a conductivity of opposite type and the contact has an upper region, the conductivity of which is of the same type as that of the first region, and a lower region, the conductivity of which is of the same type as that of the second region.

According to another aspect, the invention relates to a process for fabricating a semiconductor device on a SeOI substrate comprising a thin layer of semiconductor material separated from a base substrate by means of an insulating layer, the device comprising a first conducting region in the thin layer and a second conducting region in the base substrate, with the process comprising the formation of a contact connecting the first region to the second region through the insulating layer.

Certain preferred, but non-limiting, features of this process are the following:
forming the contact by carrying out the following steps:
etching of the semiconductor substrate in order to form therein a trench extending beyond the buried insulating layer, through the first region, until reaching the second region; and
filling of the trench with an interconnect material;
the interconnect material is a semiconductor material;
the interconnect material is predoped;
it further includes a step of doping the semiconductor material in the trench;
an upper region and a lower region of the trench are oppositely doped;
the boundary between the upper region and the lower region is located in alignment or level with the insulating layer;
the boundary between the upper region and the lower region is located in alignment or level with the thin layer above the first region; and
the interconnect material is metallic.

The invention now provides, in a simple manner, a line for connection to a semiconductor region of a semiconductor device on an SeOI substrate. More particularly, the invention limits the footprint of the device as well as the use of metal connections.

To do this, the invention proposes to connect the semiconductor region to another semiconductor region placed in the SeOI substrate on the other side from the insulating layer by providing a contact through the insulating layer.

Thus, when considering a first semiconductor region placed in the thin layer of the SeOI substrate, this first region is connected, by means of a contact through the insulating layer, to an access line formed by a second semiconductor region in the base substrate beneath the buried insulating layer.

Conversely, when considering a first semiconductor region placed in the base substrate, this first region is connected, by means of a contact through the insulating layer, to an access line formed by a second semiconductor region in the thin layer above the buried insulating layer, by means of a contact through the insulating layer.

The first situation relates for example to a first region in the thin layer of the drain-region or source-region type of an FET transistor. The invention therefore makes it possible to bury the bit line BL or the source line SL in the base substrate beneath the insulating layer.

The first situation also relates to a first region in the thin layer of the emitter-region type of a bipolar transistor associated with an FET transistor in order to inject charge into the channel of the FET transistor. The invention therefore makes it possible to bury the injection line IL connected to the emitter region in the base substrate beneath the insulating layer.

The second situation relates for example to a first region in the base substrate of the back control gate region type, placed beneath the insulating layer facing the channel of an FET transistor. The invention therefore makes it possible to access this buried back control gate via the front face of the SeOI substrate with a back control gate drive line.

In the context of the invention, the expression "connection between semiconductor regions" is understood to mean both an ohmic junction between semiconductor regions having a conductivity of the same type and a pn junction between semiconductor regions having conductivities of opposite type.

Figure 2:
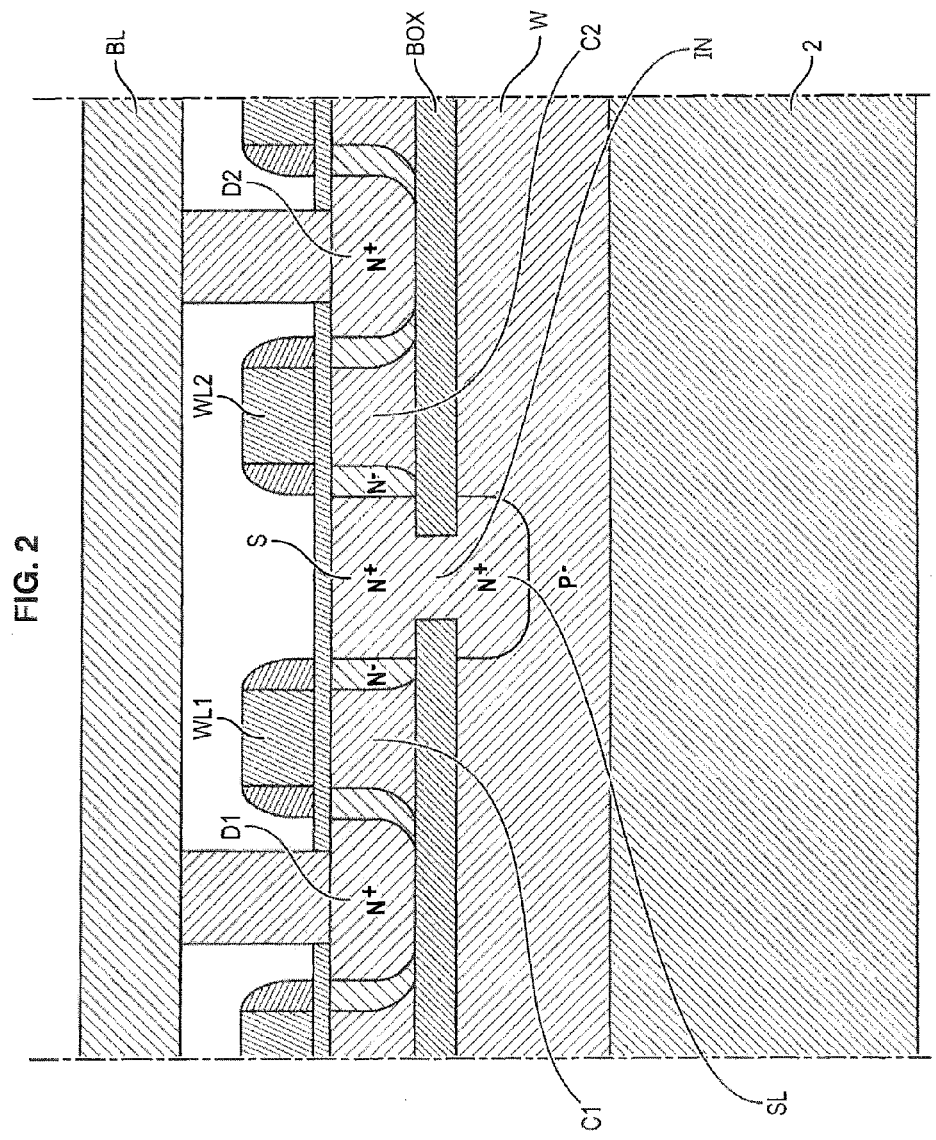
FIG. 2 shows one possible embodiment of a buried source line beneath the insulating layer and connected to a source region SL by means of a contact through the insulating layer.
Figure 3:
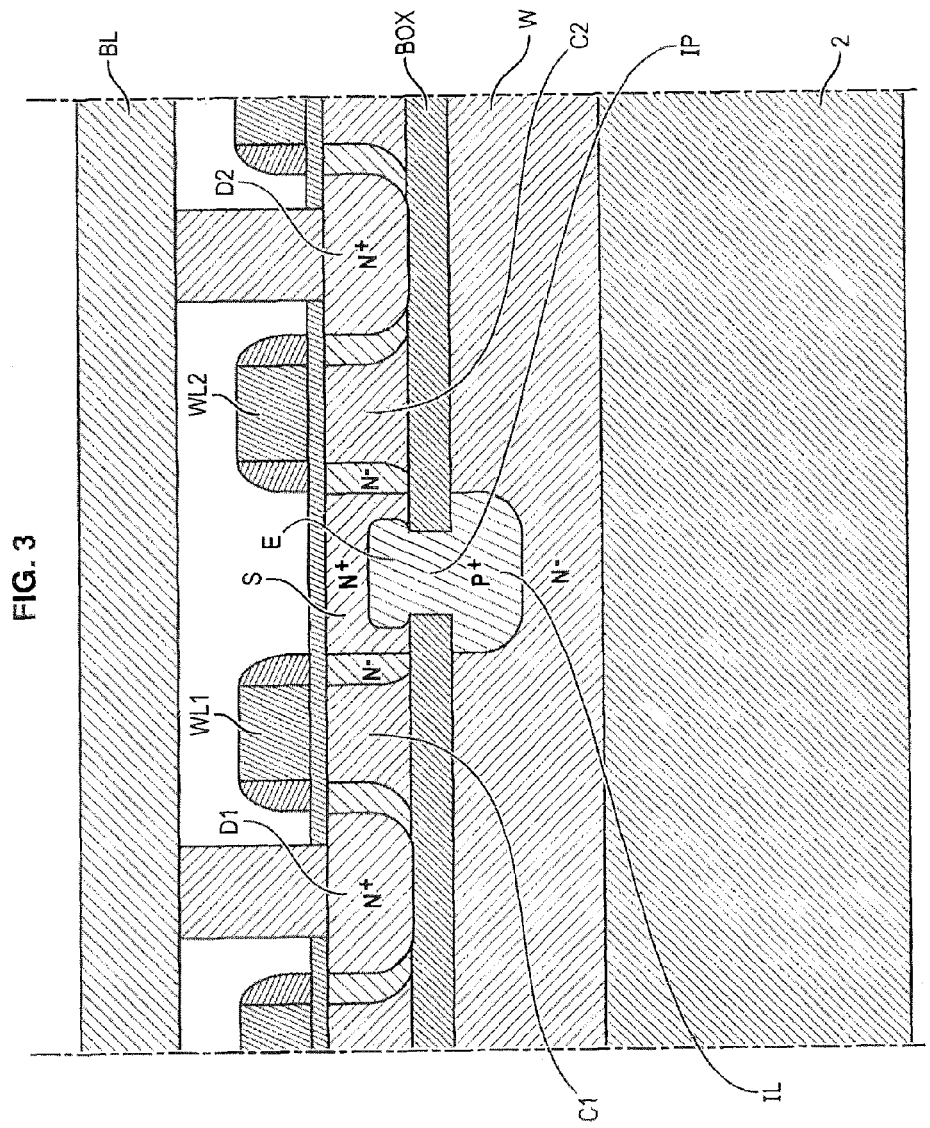
FIG. 3 shows one possible embodiment of a buried injection line beneath the insulating layer and connected to an emitter region of a bipolar transistor by means of a contact through the insulating layer.

FIGS. 1 to 3 show a sectional view of a semiconductor device according to one possible embodiment of the first aspect of the invention produced on an SeOI substrate, preferably a silicon-on-insulator (SOI) substrate, comprising a thin layer of semiconductor material separated from a base substrate by means of a buried insulating layer.

The insulating layer is for example a buried oxide (BOX) layer, typically an $SiO_2$ layer.

The semiconductor device here is a dynamic random access memory (DRAM) cell. The memory cell comprises an FET transistor having a source S, a drain D1 and a floating channel C1. A gate dielectric layer and a control gate electrode are deposited in sequence above the floating channel C1.

The drain D1 and the source S are preferably in contact with the buried oxide layer so that the FET transistor is fully depleted.

The source S may thus be shared between two adjacent memory cells (it thus also serves as source region for the FET transistor having a drain D2 and a channel C2). Such sharing enables the footprint of a memory cell to be reduced.

The drain D1 is connected to a bit line BL, the source S is connected to a source line SL and the control gate is connected to a word line WL1.

In the context of the embodiment shown in FIG. 1, the drain D1 constitutes a first semiconductor region (for example $n^+$-doped in the case of an npn-FET transistor) in the thin layer, the drain D1 being connected, by means of a contact I1 through the insulating layer BOX, to a bit line BL buried in the base substrate beneath the insulating layer BOX. The bit line BL thus forms a second semiconductor region in the base substrate.

As shown in FIG. 1, the bit line BL may especially be placed so as to connect the drain regions D1, D2 together along one row of a memory array, with a contact I1, I2 through the insulating layer provided for each of the drain regions.

In the context of the embodiment shown in FIG. 2, the source S constitutes a first semiconductor region (for example $n^+$-doped in the case of an npn-FET transistor) in the thin layer, the source S being connected, by means of a contact IN through the insulating layer BOX, to a source line SL buried in the base substrate beneath the insulating layer BOX. The source line SL thus forms a second semiconductor region in the base substrate.

It should be pointed out that the source line SL may especially be placed so as to connect the source regions together along one row of a memory array, with a contact through the insulating layer provided for each of the source regions. The buried source line SL is thus parallel to the word lines WL1, WL2.

In the context of the embodiment shown in FIG. 3, a bipolar transistor, the base of which is formed by the source S of the FET transistor and the collector of which is formed by the channel C1 of the transistor, is associated with the FET transistor in order to inject charge into the channel C1. The bipolar transistor has an emitter E which constitutes a first semiconductor region (for example $p^+$-doped in the case of an npn-FET transistor) in the thin layer. The emitter E is connected by, by means of a contact IP through the insulating layer BOX, to an injection line IL buried in the base substrate beneath the insulating layer BOX. The injection line IL thus forms a second semiconductor region in the base substrate.

In the examples shown in FIGS. 1 to 3, the first regions and the second regions have a conductivity of the same type ($n^+$ in FIGS. 1 and 2, $p^+$ in FIG. 3) and the interconnects I1, I2, IN, IP are therefore produced by means of a semiconductor material having a conductivity of the same type.

It will be understood that producing access lines with a doped semiconductor material avoids having to use metal connections.

Furthermore, the fact of burying these lines frees up surface on the front face. This architecture is also relatively flexible in so far as a buried access line may extend beneath a plurality of memory cells, a single connection then being necessary for addressing the line and consequently said plurality of cells.

It will also be understood that the buried lines (bit line in FIG. 1, source line in FIG. 2, injection line in FIG. 3) are preferably isolated from the base substrate by means of a well W of opposite conductivity, in order to create a diode serving as both lateral and underlining isolation.

However, the invention also extends to the case in which the first region and the second region are of opposite conductivity. In this situation, the contact enables a p-n junction to be produced.

The contact may therefore have an upper region of the same conductivity type as that of the first region and a lower region of the same conductivity type as that of second region.

In an alternative embodiment, the contact may be produced by means of a material of metallic nature, especially a silicide (for example $WSiO_2$).

It should be noted that although memory transistors have been shown in FIGS. 1, 2 and 3, it is however obvious that the invention applies to all types of connection between logic MOS transistors.

Various embodiments of a semiconductor device according to the first aspect of the invention will be described below with reference to FIGS. 4-9.

Figure 4:
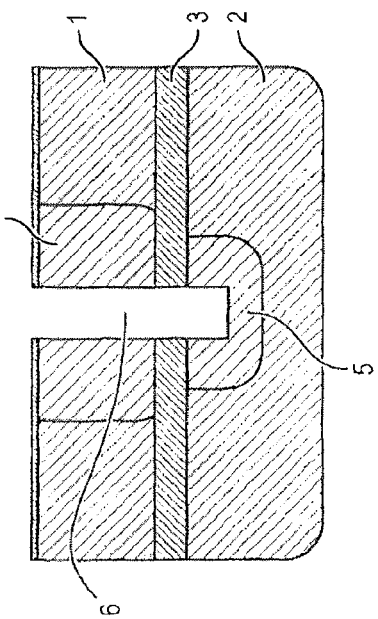
FIG. 4 shows two conducting regions of a semiconductor device, a first region being placed in the thin layer, whereas the second region is placed in the base substrate.

FIG. 4 shows an SeOI substrate comprising a thin layer 1 separated from a base substrate 2 by means of a buried insulating layer 3. The thin layer 1 typically has a thickness of between a few nm and a few tens of nm depending on whether the device is fully depleted or partially depleted. The insulating layer 3 itself has a thickness typically between one nm and several tens of nm.

A first semiconductor region 4 is placed in the thin layer 1 above the insulating layer, while a second semiconductor region 5 is placed in the base substrate beneath the insulating layer.

It will be understood that the first and second regions 4, 5 are not necessarily produced before the formation of the interconnect described below, but they may be produced during this formation, or even once the interconnect has been formed.

Figure 5:
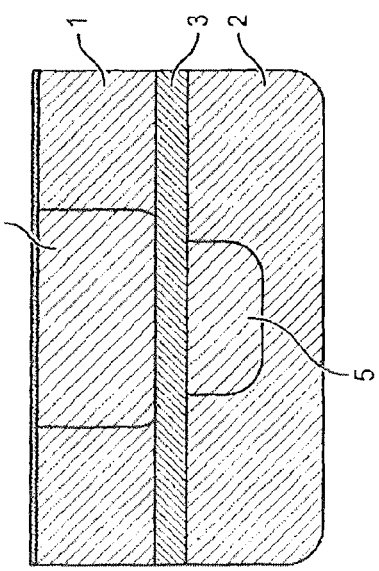
FIG. 5 shows the production of a trench extending beyond the buried insulating layer, through the first region, right into the second region.

Referring to FIG. 5, the semiconductor substrate is etched so as to form therein a trench 6 extending beyond the buried insulating layer, through the first region 4, until reaching the second region 5.

Figure 6:
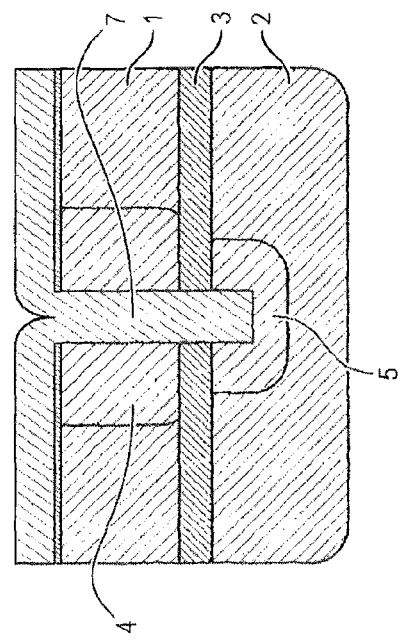
FIG. 6 shows the filling of the trench with an interconnect material.
Figure 7A:
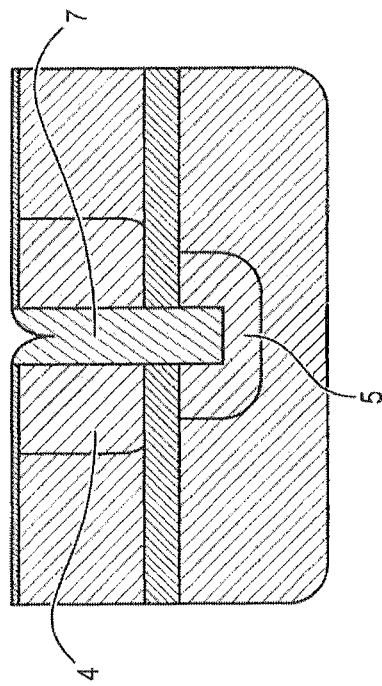
FIGS. 7a and 7b show two alternative ways of etching the interconnect material, carried out with and without a lithography mask respectively.
Figure 7B:
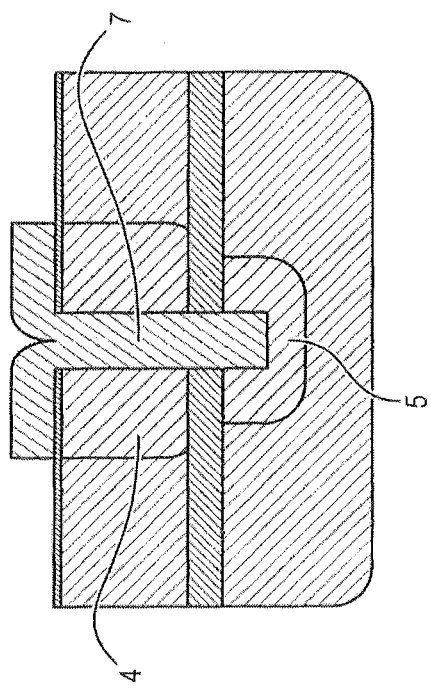

As shown in FIG. 6, the trench 6 is then filled with an interconnect material 7.

The interconnect material may be metallic (for example a silicide: $WSiO_2$). Thus, an ohmic contact is made through the insulating layer between the first region 4 and the second region 5.

The interconnect material is preferably a semiconductor material, typically the same material as that of the thin layer of the SeOI substrate.

Taking for example an SOI substrate, amorphous or polycrystalline silicon is deposited on the surface of the SOI substrate in order to fill the trench.

Alternatively, an atomic layer of silicon may be deposited by ALD (atomic layer deposition).

Next, a lithography mask is positioned on the surface of SeOI substrate, the mask covering the regions that it is desired to retain. A material deposited in the regions not covered is then etched (cf. FIG. 7a).

As a variant (cf. FIG. 7b), a lithography mask is not used and a localized etching operation of the RIE (reactive ion etching) type is carried out so as to remove all of the material deposited on the surface of the substrate.

The deposited material is preferably doped. Thus, when the regions to be connected are both of $n^+$-type conductivity (cf. FIGS. 1 and 2) or both of $p^+$-type conductivity (cf. FIG. 3), the deposited material is of $n^+$-type or $p^+$-type conductivity respectively.

It should be noted that the method may therefore require two passes: one for filling certain trenches with $n^+$-Si and the other for filling other trenches with $p^+$-Si. It is then preferable to use a lithography mask in order to avoid any risk of a short circuit. In this regard, it should be noted that making metallic interconnects requires only one filling pass.

As a variant, the material may be doped subsequently. When the two regions to be connected have the same conductivity type, the regions of the trench which are lying in the first region, in the insulating layer and in the second region are then doped with the same type.

Figure 8:
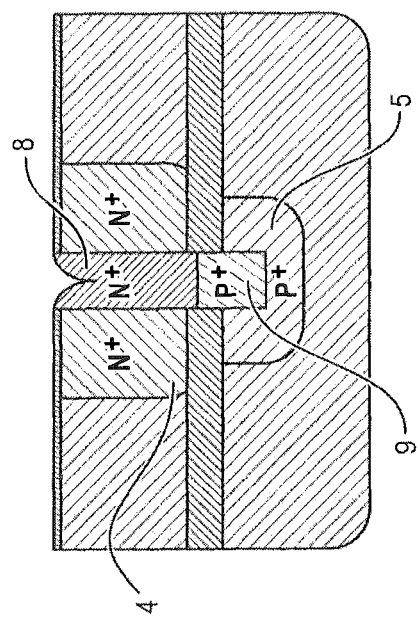
FIG. 8 illustrates an embodiment in which the first conducting region does not contact the front face of the SeOI substrate.

In the case shown in FIG. 8 in which the first region 4 is not in contact with the front face of the SeOI substrate, an upper region 8 and a lower region 9 of the trench have conductivities of opposite type, with the boundary between the upper region and the lower region located level with the thin layer 1 above the first region 4. Thus, when the regions to be connected are of $p^+$-type, the lower region of the trench is of $p^+$-type and the upper region of $n^+$-type above the first region 4, the junction being made in the thin single-crystal layer. These conductivities of opposite type may be obtained by implantation or by epitaxy, with $n^+$-type doping in the upper region and $p^+$-type doping in the lower region in the example shown.

Figure 9:
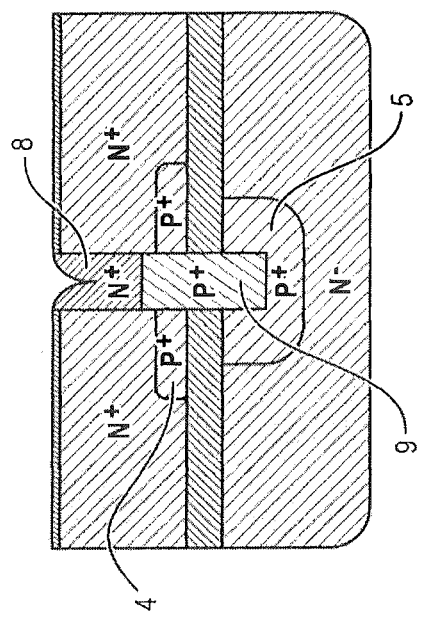
FIG. 9 illustrates an embodiment in which the first region and the second region have conductivities of opposite type.

The invention also extends to the case shown in FIG. 9 of first and second regions to be connected that have conductivities of opposite type, with a contact of the p-n junction type. The procedure is then in the manner just described by forming, in the trench, an upper region 8 and a lower region 9 of opposite conductivity type (the upper region having a conductivity of the same type as that of the first region, for example $n^+$-type, the lower region having a conductivity of the same type as the second region, for example $p^+$-type). The boundary between the lower and upper regions of the trench defines the location of the p-n junction. This junction is preferably chosen to be level with the insulating layer.

It should also be noted that if the trench is filled with undoped semiconductor material, it is also possible to carry out an annealing operation so that the dopants from the first region 4 and from the second region 5 diffuse back into the contact. The level of doping of the first region 4 and of the second region 5 must therefore be initially very high (of the order of $10^{20}$) in order to take into account the dilution of this level of doping towards the contact. If the regions 4 and 5 have the same polarity, ohmic contact is created. In contrast, if the regions 4 and 5 are oppositely doped, a diode is created. It should be understood that the diode thus created makes it possible in particular to associate a bipolar transistor with a memory cell (cf. FIG. 3 also) by forming a fourth drive electrode for the injection, thereby permitting the memory cell to be operated at a lower voltage for writing and for erasure.

What is claimed is:

1. A process for fabricating a semiconductor device on a semiconductor-on-insulator substrate, wherein the semiconductor-on-insulator substrate comprises a thin layer of semiconductor material separated from a base substrate by a buried insulating layer, and the semiconductor device comprises a first conducting region of a memory cell in the thin layer and a second conducting region in the base substrate, wherein the process comprises:

providing an access line in the base substrate beneath the buried insulating layer for forming the second conducting region, wherein the access line comprises a buried bit line or a buried source line, and wherein the access line is isolated by a lateral and underlining isolation well of opposite conductivity of the access line; and providing a contact immediately below the first conducting region for connecting the first conducting region to the access line.

2. The process according to claim 1, wherein the contact is formed by:

etching the semiconductor-on-insulator substrate in order to form therein a trench extending through the first conducting region and extending beyond the buried insulating layer to the second conducting region; and filling the trench with an interconnect material.

3. The process according to claim 2, wherein the interconnect material is a predoped semiconductor material.

4. The process according to claim 2, wherein the interconnect material is a semiconductor material and which further includes a step of doping the semiconductor material in the trench.

5. The process according to claim 4, wherein the doping of the semiconductor material in the trench is performed by an annealing operation that diffuses dopants in the trench.

6. The process according to claim 1, wherein the first conducting region is a drain region or a source region of a transistor.

7. The process according to claim 1, wherein the second conducting region is a back control gate region of a transistor and the first conducting region belongs to a back control gate drive line.

8. A process for fabricating a semiconductor device, the process comprising:

forming a base substrate;

forming an access line;

forming a buried insulator layer over the base substrate and the access line;

forming a thin layer of semiconductor material on the buried insulator layer, wherein the thin layer of semiconductor material is separated from the base substrate by the buried insulator layer;

forming first conducting regions of a plurality of cells within the thin layer of semiconductor material, wherein the access line extends beneath the plurality of cells to provide shared addressing of the plurality of cells, and wherein the access line is isolated by a lateral and underlining isolation well of opposite conductivity of the access line;

forming interconnects through the buried insulator layer to connect corresponding first conducting regions within the thin layer of semiconductor material to the access line.

9. The process of claim 8, wherein forming the access line further comprises forming the access line of a conducting material.

10. The process of claim 9, wherein forming the access line of the conducting material further comprises forming the access line of a doped semiconductor material.

11. The process of claim 8, wherein forming the interconnects further comprises forming trenches extending from the first conducting regions through the buried insulator layer to the access line.

12. The process of claim 11, wherein forming the interconnects further comprises filling the trenches with an interconnect material.

13. The process of claim 12, wherein filling the trenches with the interconnect material further comprises filling the trenches with a metallic interconnect material.

14. The process of claim 12, wherein filling the trenches with the interconnect material further comprises filling the trenches with a semiconductor material.

* * * * *